US011048173B2

(12) United States Patent
Baumer (10) Patent No.: US 11,048,173 B2
(45) Date of Patent: Jun. 29, 2021

(54) METHOD FOR RESTORING AN ILLUMINATION SYSTEM FOR AN EUV APPARATUS, AND DETECTOR MODULE (71) Applicant: Carl Zeiss SMT GmbH, Oberkochen (DE)

(72) Inventor: Florian Baumer, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/849,353

(22) Filed: Apr. 15, 2020

(65) Prior Publication Data

US 2020/0249575 A1 Aug. 6, 2020

Related U.S. Application Data (63) Continuation of application No. PCT/EP2018/079105, filed on Oct. 24, 2018.

(30) Foreign Application Priority Data

Oct. 26, 2017 (DE) .......................... 102017219179.1

(51) Int. Cl.
*G03B 27/52* (2006.01)
*G03B 27/54* (2006.01)
*G03B 27/58* (2006.01)
*G03F 7/20* (2006.01)

(52) U.S. Cl.
CPC .................... *G03F 7/702* (2013.01)

(58) Field of Classification Search
CPC .... G03F 7/702; G03F 7/7085; G03F 7/70158; G03F 7/70133; G03F 7/70116; G03F 7/7055; G03F 7/70091; G03F 7/70633; G03F 7/70558; G03F 7/705; G03F 7/70641; G03F 7/706; G03F 7/70191; G03F 7/70258; G03F 7/70058; G03F 1/84; G03F 9/7088; G03F 7/70566; G03F 7/70625; G03F 7/70516; G03F 7/70483; G03F 7/70075; G03F 7/70975; G03F 7/70033; G03F 7/70141; G06T 7/0004; G01M 11/005; G01B 11/00; G02B 27/62; G02B 26/00; G02B 26/0816; G01J 1/42; B82Y 10/00
See application file for complete search history.

(56) References Cited

U.S. PATENT DOCUMENTS

| 7,473,907 | B2 | 1/2009 | Singer et al. |
| 10,209,620 | B2 | 2/2019 | Petri et al. |
| 10,514,608 | B2 | 12/2019 | Baier et al. |
| 2008/0049206 | A1* | 2/2008 | Ossmann ............ G03F 7/70108 355/68 |
| 2014/0285783 | A1* | 9/2014 | Dinger ................... B82Y 10/00 355/67 |

FOREIGN PATENT DOCUMENTS

| DE | 10 2015 216 528 | 3/2017 |
| WO | WO 2017153165 | 9/2017 |

OTHER PUBLICATIONS

International Search Report and Written Opinion from the counterpart PCT Application No. PCT/EP2018/079105, dated Feb. 22, 2019.

* cited by examiner

*Primary Examiner* — Mesfin T Asfaw
(74) *Attorney, Agent, or Firm* — Fish & Richardson P.C.

(57) ABSTRACT

A method for restoring an illumination system installed in an EUV apparatus is provided.

20 Claims, 5 Drawing Sheets

METHOD FOR RESTORING AN ILLUMINATION SYSTEM FOR AN EUV APPARATUS, AND DETECTOR MODULE

CROSS-REFERENCE TO RELATED APPLICATIONS

The present application is a continuation of, and claims benefit under 35 USC 120 to, international patent application PCT/EP2018/079105, filed Oct. 24, 2018, which claims benefit under 35 USC 119 to German patent application DE 10201729179.1, filed Oct. 26, 2017. The entire disclosures of these applications are incorporated by reference herein.

FIELD

The disclosure relates to a method for restoring an illumination system installed in an EUV apparatus and to a detector module for measuring system measurement variables in an illumination field in an exit plane of an illumination system in an EUV apparatus. The EUV apparatus can be, for example, a projection exposure apparatus for EUV microlithography or a mask inspection apparatus, employing EUV radiation, for inspecting masks (reticles) for EUV microlithography.

BACKGROUND

Lithographic projection exposure methods are predominantly used nowadays for producing semiconductor components and other finely structured components, such as, for example, masks for photolithography. In this case, use is made of masks (reticles) or other patterning devices that bear or form the pattern of a structure to be imaged, for example a line pattern of a layer of a semiconductor component. The pattern is positioned in a projection exposure apparatus between an illumination system and a projection lens in the region of the object plane of the projection lens and is illuminated with an illumination radiation shaped by the illumination system. The radiation modified by the pattern travels through the projection lens as projection radiation, the projection lens imaging the pattern with a reduced scale onto the substrate to be exposed. The surface of the substrate is arranged in the image plane of the projection lens optically conjugate to the object plane. The substrate is generally coated with a radiation-sensitive layer (resist, photoresist).

One of the aims in the development of projection exposure apparatuses is to lithographically produce structures having smaller and smaller dimensions on the substrate, for example to obtain greater integration densities in semiconductor components. One approach includes working with shorter wavelengths of the electromagnetic radiation. By way of example, optical systems have been developed which use electromagnetic radiation from the extreme ultraviolet range (EUV), in particular having operating wavelengths in the range of between 5 nanometres (nm) and 30 nm, in particular of 13.5 nm.

An EUV projection exposure apparatus comprising an illumination system is known e.g. from U.S. Pat. No. 7,473,907 B2. The illumination system is designed for receiving EUV radiation of an EUV radiation source and for shaping illumination radiation from at least one portion of the received EUV radiation. The illumination radiation is directed into an illumination field in an exit plane of the illumination system during exposure operation, wherein the exit plane of the illumination system and the object plane of the projection lens advantageously coincide. The illumination radiation is characterized by specific illumination parameters and is incident on the pattern within the illumination field with a defined position, shape and size at defined angles. The EUV radiation source, which may be a plasma source, for example, is arranged in a source module separate from the illumination system, the source module generating a secondary radiation source at a source position in an entrance plane of the illumination system.

Arranged in a housing of an illumination system of the type considered here are a plurality of mirror modules, which are each located in the final installed state at installation positions that are provided for the mirror modules. The mirror modules or reflective mirror surfaces of the mirror modules define an illumination beam path extending from the source position to the illumination field. Generally, the mirror modules include a first mirror module having a first facet mirror at a first installation position of the illumination system and a second mirror module having a second facet mirror at a second installation position of the illumination system. A mirror module of this type has a main body acting as a carrier, on which facet elements with reflective facets are mounted alone or in groups in accordance with a specific local distribution. Further mirror modules (one or more) can be provided in the illumination beam path.

If the reflective facets of the first facet mirror are situated at or near a field plane of the illumination system that is conjugate to the exit plane, the first facet mirror is frequently also referred to as a "field facet mirror." Correspondingly, the second facet mirror is frequently also referred to as a "pupil facet mirror" if the reflective facets thereof are situated at or near a pupil plane which is Fourier-transformed in relation to the exit plane.

The two facet mirrors contribute in the illumination system of the EUV apparatus to the homogenization or mixing of the EUV radiation.

WO 2017/153165 A1 by the applicant describes a method for producing an illumination system, which allows systematic optimization of the mirror positions after installation, with the result that the desired optical performance can be attained within an acceptable time period. In some method variants, a swap operation of a mirror module is performed, in which a mirror module is disassembled from its installed position and removed from the illumination system, a mirror module with nominally the same design is installed in the installation position in place of the removed mirror module and the installed mirror module is adjusted in rigid body degrees of freedom in the installation position while changing the relative orientation of the mirror module. Here, before the swap operation, a reference measurement is performed in order to capture a reference state that represents the adjustment state before the start of the swap operation. After the swap operation has finished, a comparison measurement is performed and the adjustment state measured in the process is compared to the reference state in order to restore the alignment state from before the swap operation. In order to characterize the alignment state, a plurality of system measurement variables are preferably established from the captured measurement values, namely the position of the illumination field in the exit plane (also referred to as "field position"), a spatial distribution of measurement light in a pupil plane, which is Fourier transformed in relation to the exit plane, of the illumination system (which determines the telecentricity at the reticle level or in the exit plane), and the position of a measurement light spot on a facet of the second facet mirror. These measurement variables are each established by way of measurements at a multiplicity of field points in the illumination field. To this end, the detector module is designed such that it can be used for all measurement modes and any desired switch between different measurement modes is possible without great effort. The detector module has a field camera and a pupil camera, wherein the field camera can be used to capture an intensity distribution in a field plane of the illumination system and the pupil camera can be used to capture an intensity distribution in a pupil plane of the illumination system. By way of a simple displacement of the entire detector module, e.g., by way of a transverse displacement, the cameras can selectively be brought into their capture position for a field point. To this end, the detector module can be adjusted in terms of its position with the aid of electrically actuatable positioning drives. The method can be used both during the first production (new production) of an illumination system at the producer and during a repair or restoration of an illumination system installed in an EUV apparatus at the customer.

SUMMARY

The disclosure seeks to provide a generic method for restoring an illumination system, in which it is possible to systematically optimize the mirror positions after installation in such a way that the desired optical performance can be attained within an acceptable time period. Further, the disclosure seeks to provide a cost-effective, compact, portable detector module, which can be used for carrying out the method.

In an aspect, the disclosure provides a method for restoring an illumination system installed in an EUV apparatus. The illumination system is configured to receive, during operation of the EUV apparatus, EUV radiation of an EUV radiation source at a source position in an entrance plane and to shape, from at least one portion of the received EUV radiation, illumination radiation that is directed into an illumination field in an exit plane of the illumination system and in the illumination field fulfils an illumination specification. The illumination system comprises a plurality of mirror modules installed at assigned installation positions and which define an illumination beam path leading from the source position to the illumination field. The method comprises a swap operation of one of the mirror modules, in which the mirror module is disassembled from its installed position and removed from the illumination system, a mirror module with nominally the same design is installed in the installation position in place of the removed mirror module, and the installed mirror module is adjusted in rigid body degrees of freedom in the installation position while changing the relative orientation of the installed mirror module. Before the swap operation, a reference measurement is performed to capture a reference state that represents the adjustment state before the start of the swap operation. After the swap operation has finished, a comparison measurement is performed and the adjustment state measured in the process is compared to the reference state in order to restore the adjustment state from before the swap operation. The following are measured during the reference measurement and the comparison measurement: 1) positions of a first end portion and a second end portion, lying opposite the first end portion, of the illumination field, with the position of the illumination field not being measured in an intermediate portion lying between the first and the second end portion; and 2) a spatial distribution of measurement light in a pupil plane that is Fourier-transformed in relation to the exit plane for a field point lying in the intermediate portion.

In an aspect, the disclosure provides a detector module for a measurement system for measuring system measurement variables in an illumination field in an exit plane of an illumination system in an EUV apparatus. The detector module comprises a field sensor arrangement for capturing the positions of a first end portion and a second end portion, lying opposite the first end portion, of the illumination field, with the position of the illumination field in an intermediate portion lying between the first and the second end portion not being capturable. The detector module also comprises a pupil sensor arrangement for capturing a spatial distribution of measurement light in a pupil plane that is Fourier-transformed in relation to the exit plane for a field point lying in the intermediate portion.

The method is based on a relative measurement or on a comparison between the result of a reference measurement and the result of a comparison measurement, performed in the same way, at a later time. The intention here is to capture changes in the illumination system in the interim time between the reference measurement and comparison measurement.

The inventors have recognized that there are peculiarities in the relative measurement technique that can be used to employ a measurement technique that is simpler and more cost-effective than at least certain known measurement techniques and that can supply sufficiently accurate measurement variables with less time expenditure. These advantages can be used, for example, when replacing a mirror of an illumination system at the location of use.

In the relative measurement technique for the mirror replacement, the assumption is made that, initially (prior to the replacement of a mirror module), a sufficiently well adjusted illumination system is present. During the reference measurement, which is performed after attaching the components of the measurement system (measurement light source module and detector module), the "position of the illumination field" (corresponding to "field position"), "spatial distribution of measurement light in the pupil plane" (corresponding to "telecentricity") and the "position of the measurement light spots on the facets of the second mirror module" (corresponding to "spot centring") system measurement variables, for example, accordingly meet the desired properties. For a relative alignment, it is not necessary to measure the telecentricity at different field points (unlike within the scope of the original alignment during the first production of the illumination system at the producer). In principle, the measurement at a single field point suffices here. Should, specifically, the illumination system be adjusted after the mirror swap (by an alignment at the installed mirror module and, optionally, accompanying alignments at other mirror modules) in such a way that the telecentricity at this one field point is identical or virtually identical to the situation before the swap of the mirror module (i.e., during the reference management) again (within the scope of the measurement and alignment tolerances), this ensures that the telecentricity at all other field points is also sufficiently good. Consequently, it is not necessary to measure the telecentricity for a plurality of different field points.

To this end, the inventors have developed a system measurement technique with a compact, mobile detector module that, in the case of a mirror module swap in the field (at the end user), can be attached to the illumination system in order to supply, with the appropriate accuracy, the system measurement variables desired for the system alignment within a short period of time.

Similar to known methods, the method comprises a swap operation of a mirror module, in which one of the mirror modules is disassembled from its installed position and removed from the illumination system, a mirror module with nominally the same design is installed in the installation position in place of the removed mirror module and the installed mirror module is adjusted in rigid body degrees of freedom in the installation position while changing the relative orientation of the installed mirror module. Here, before the swap operation, a reference measurement is performed in order to capture a reference state that represents the adjustment state before the start of the swap operation. A comparison measurement is performed after finishing the swap operation. The alignment state or adjustment state measured in the process is compared to the reference state in order to restore the adjustment state before the swap operation.

During the alignment after installation of the swapped-in mirror module, it is optionally possible to likewise use the alignment degrees of freedoms of other, non-replaced mirror modules of the illumination system in order to optimize the performance and bring this as close as possible to the reference state again. Thus, it is possible to perform a system alignment with a post-adjustment of a plurality of optical elements.

Now, a peculiarity in relation to known technology includes being able to carry out the reference measurement and the comparison measurement substantially more easily and substantially more quickly than in the known technology. In the reference measurement and in the comparison measurement, positions of a first end portion and of a second end portion, lying opposite the first end portion, of the illumination field are measured, with, preferably, the position of the illumination field not being measured in the intermediate portion lying between the first and the second end portion. Moreover, a spatial distribution of measurement light in a pupil plane that is Fourier-transformed in relation to the exit plane is measured for a field point lying in the intermediate portion. This information is not captured in field points in the end portions. Consequently, different, adjacent, non-overlapping portions of the illumination field to be measured are used for determining different measurement variables. While those measurements that can be used for determining the position of the illumination field are performed in the end portions, no such position measurement is performed in the intermediate portion lying therebetween. Rather, this portion is used to measure a further measurement variable, namely for the spatial distribution of measurement light in the aforementioned pupil plane for (at least) one field point lying in the intermediate portion.

This implements, inter alia, the discovery that, during the aforementioned relative measurement, the measurement variables that are important for characterizing the alignment state need not all be measured in the entire illumination field (or for many field points distributed over the illumination field). Subdividing the illumination field into the two end portions and the intermediate portion lying therebetween also provides the option of simultaneously performing the measurements for determining the aforementioned measurement variables. As a result, substantially shorter measurement times become possible in comparison with the known technology.

The measurement technique is particularly suitable for EUV apparatuses that are designed for a scanner operation and accordingly have a slot-shaped illumination field with a relatively low height in the scanning direction (y-direction) and a width that is relatively large in comparison with the height in the cross-scan direction (x-direction) perpendicular or orthogonal thereto. The illumination field can be rectangular or curved in arcuate fashion. The term "end portion" in this case relates to the two end portions of the illumination field in the cross-scan direction. The first end portion and the second end portion preferably each include less than 50% of the illumination field in the x-direction such that a sufficiently large intermediate portion remains between the end portions for the purposes of performing the measurement for the spatial distribution of the measurement light in the pupil plane. By way of example, the length of an end portion in this cross-scan direction can be less than 40% or less than 30% of the width of the illumination field. In order to obtain a sufficiently large measurement region for an accurate determination of the field position, it appears advantageous, on the other hand, if each end portion comprises more than 10% or more than 20% or more than 30% of this width.

Even though it is possible, during the reference measurement and/or the comparison measurement, to perform the position of the end portions and the measurement for determining the spatial distribution of measurement light in the pupil plane successively in time in any sequence, provision is made in preferred embodiments for the positions of the end portions and the spatial distribution of measurement light in the pupil plane for the field point lying in the intermediate portion to be measured simultaneously during the reference measurement and/or during the comparison measurement. As a result, the measurement time overall can be kept short.

The aforementioned subdivision of the illumination field into different portions for the purposes of measuring different measurement variables offers the additional advantage that the reference measurement and the comparison measurement can be performed, as is the case in a preferred embodiment, as a non-scanning or static measurement using a detector module, assembled at a fixed position, without displaceable optical components. Such a detector module involves no movable parts, in particular no controllable displacement shafts, and so the detector module can have a compact design with a small size and low weight. These properties are particularly advantageous for the transportation and assembly of the detector module at the illumination system installed in the EUV apparatus. The inherently unmovable or rigid design without displacement shafts is not only realizable in substantially more cost-effective fashion than variants with a movable detector module, as in the prior art, but it is also advantageous for the mechanical robustness and stability This also results in particularly simple measurement process since no actuation of displacement shafts is involved for a possible swap between sensors of the detector module. Furthermore, possible negative influences of drift behaviour during the measurement and alignment process can be kept low on account of this inherently rigid construction.

In some method variants, the spatial distribution of measurement light in a pupil plane that is Fourier-transformed in relation to the exit plane is measured only for a single field point lying in the intermediate portion. It was recognized that this measurement that is quick and easy to perform suffices in the case of the relative measurements, underlying here, in order to ensure the desired accuracy of the telecentricity measurement. The telecentricity also can be measured for a plurality of field points lying at a distance from one another within the intermediate region, for example in order to form a mean value. However, in principle, a measurement at a plurality of field points is not necessary.

In some method variants, provision is made fort the spatial distribution of measurement light in a pupil plane that is Fourier-transformed in relation to the exit plane to be measured for a field point lying in the centre between the ends of the illumination field. If this central region between the ends of the illumination field is used for the telecentricity measurement, the end regions used for measuring the field position could extend particularly far in the direction of the centre, as a result of which, in principle, a higher measurement accuracy can be obtained in the end regions.

A detector module according to the disclosure for a measurement system for measuring system measurement variables in an illumination field in an exit plane of an illumination system of an EUV apparatus comprises a field sensor arrangement and a pupil sensor arrangement. The field sensor arrangement is designed for capturing the positions of a first end portion and a second end portion, lying opposite the first end portion, of the illumination field, with the position of the illumination field in an intermediate portion lying between the first and the second end portion not being capturable. The pupil sensor arrangement is embodied for capturing a spatial distribution of measurement light in a pupil plane that is Fourier-transformed in relation to the exit plane for a field point lying in the intermediate portion.

The field sensor arrangement preferably comprises a first field sensor for capturing the position of the first end portion and, separate therefrom, a second field sensor for capturing the position of the opposite second end portion of the illumination field, wherein a stop with a passage opening for measurement light from the intermediate region lies between the first field sensor and the second field sensor and a pupil sensor is assigned to the stop. For the pupil measurement (i.e., the capture of the spatial distribution of the measurement light in the aforementioned pupil plane), a Fourier optical unit can be arranged between the aperture in the stop and the pupil sensor in order to image the pupil plane as sharply as possible on a two-dimensional pupil sensor. The Fourier optical unit can comprise one or more lens elements and/or one or more mirrors. In principle, it would also be possible to have a pupil sensor arrangement that operates in the style of a pinhole camera without an interposed optical unit between aperture and pupil sensor. In this case, the passage opening should have the smallest possible diameter in order to still obtain small, cleanly separable measurement light spots from the pupil in the sensor plane of the pupil sensor.

In one embodiment, the stop is embodied as the slit stop, wherein the aperture has an elongate slot shape and extends parallel to the scanning direction (Y-direction) over the entire illumination field and beyond the edges thereof in the scanning direction. A scan-integrated measurement of the telecentricity in relation to a field point lying in the region of the slit stop is possible with the aid of such a slit stop. The aperture can also have a round, in particular circular, or rectangular, in particular square, design.

Aspects of the method may also be advantageous independently of a swap operation of a mirror module. A relative measurement (with a comparison between the results of reference measurement and comparison measurement) may also be advantageous without intermediate swap operation. By way of example, it is possible to perform a method for monitoring an illumination system installed in an EUV apparatus, in which work is carried out with the EUV light as a measurement light, the EUV light also being used during production operation. In this situation, too, the illumination system comprises a plurality of mirror modules which are installed at assigned installation positions and which define an illumination beam path leading from the source position to the illumination field. Within the scope of the method, a reference measurement is performed in a first measurement time interval in order to capture a reference state that represents the adjustment state at the time of the first measurement time interval and a comparison measurement is performed after a predeterminable or calculable measurement-free interim period has elapsed and the adjustment state measured in the process is compared to the reference state. Thus, a relative measurement is performed, within the scope of which changes in the performance, which have emerged in the interim time between the reference measurement and the comparison measurement, can be identified. The following are measured during the reference measurement and the comparison measurement: positions of a first end portion and a second end portion, lying opposite the first end portion, of the illumination field, with the position of the illumination field not being measured in an intermediate portion lying between the first and the second end portion; and a spatial distribution of measurement light in a pupil plane that is Fourier-transformed in relation to the exit plane for a field point lying in the intermediate portion.

Preferably, a detector module of the type described in this application is used for the reference measurement and the comparison measurement. The detector module may remain permanently assembled at the illumination system.

BRIEF DESCRIPTION OF THE DRAWINGS

Advantages and aspects of the disclosure are evident from the claims and from the following description of preferred exemplary embodiments of the disclosure, which are explained below with reference to the figures, in which:

DETAILED DESCRIPTION OF EXEMPLARY EMBODIMENTS

Figure 1:
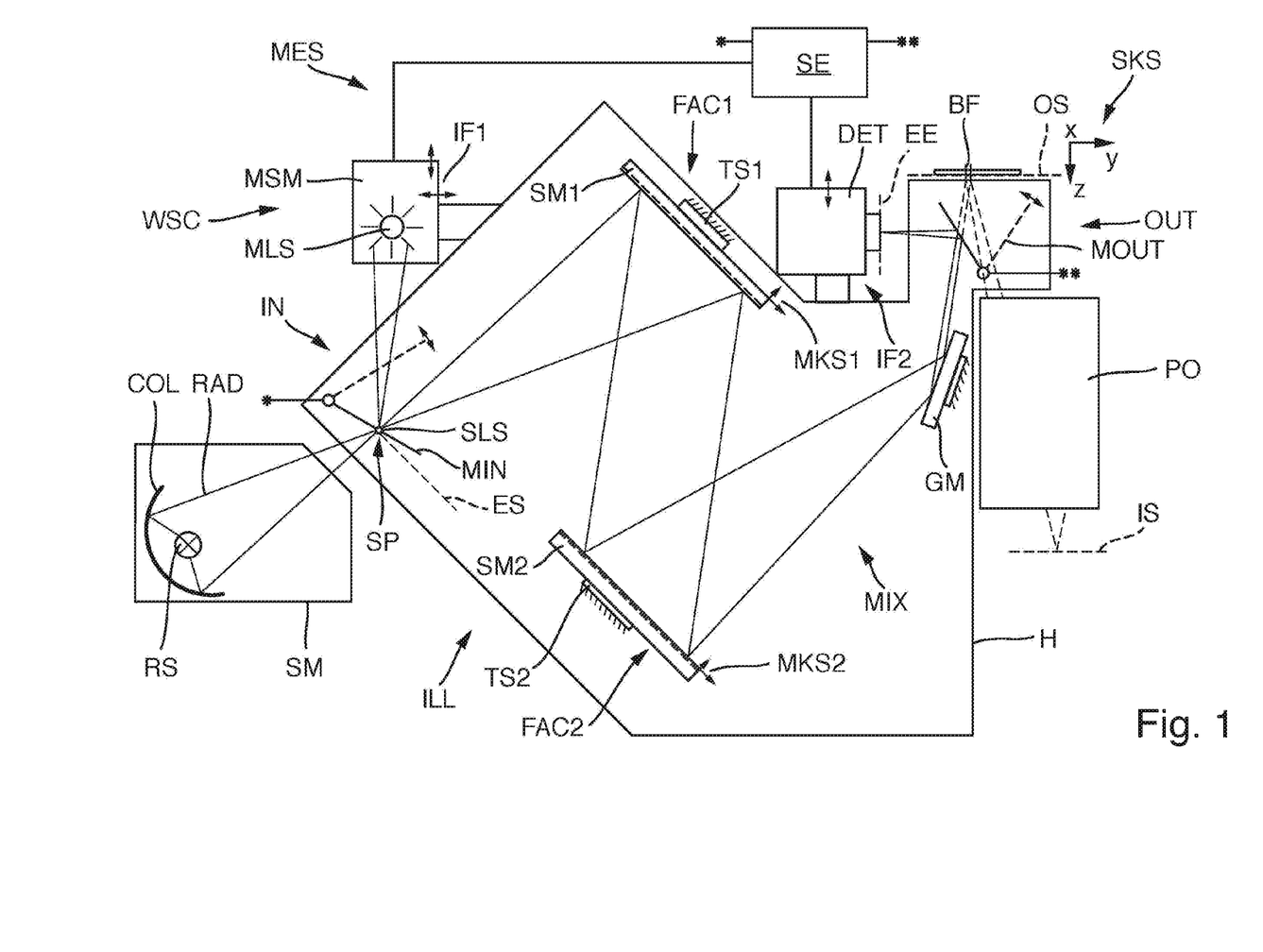
FIG. 1 schematically shows optical components of an EUV microlithographic projection exposure apparatus with a detector module in accordance with an embodiment of the disclosure.

FIG. 1 shows by way of example optical components of an EUV microlithographic projection exposure apparatus WSC. The EUV microlithographic projection exposure apparatus serves during an operation for exposing a radiation-sensitive substrate W, which is arranged in the region of an image plane IS of a projection lens PO, with at least one image of a pattern of a reflective mask (here also alternatively referred to as reticle), the pattern being arranged in the region of an object plane OS of the projection lens. In the case of the example, the substrate is a wafer composed of semiconductor material that is coated with a light-sensitive resist layer.

To facilitate understanding of the description, a Cartesian system coordinate system SKS is indicated, which reveals the respective orientation relationship of the components illustrated in the figures. The projection exposure apparatus WSC is of the scanner type. The x-axis extends perpendicularly into the plane of the drawing. The y-axis extends toward the right. The z-axis extends downward in the plane of the drawing. The object plane OS and the image plane IS both run parallel to the x-y-plane. During the operation of the projection exposure apparatus, the mask and the substrate are moved synchronously or simultaneously in the y-direction (scanning direction) during a scan operation and are thereby scanned.

The apparatus is operated with the radiation from a primary radiation source RS. An illumination system ILL serves for receiving the radiation from the primary radiation source and for shaping illumination radiation directed onto the pattern. The projection lens PO serves for imaging the pattern onto the light-sensitive substrate.

The primary radiation source RS may be, inter alia, a laser plasma source or a gas discharge source or a synchrotron-based radiation source or a free electron laser (FEL). Such radiation sources generate a radiation RAD in the EUV range, in particular having wavelengths of between 5 nm and 15 nm, preferably 13.5 nm. The illumination system and the projection lens are constructed with components that are reflective to EUV radiation in order that they can operate in this wavelength range.

The primary radiation source RS is situated in a source module SM, which is separate from the illumination system ILL and also has, inter alia, a collector COL for collecting the primary EUV radiation. The source module SM generates during exposure operation a secondary radiation source SLS at a source position SP in an entrance plane ES of the illumination system ILL. The secondary radiation source SLS is the optical interface between the EUV radiation source or the source module SM and the illumination system ILL.

The illumination system comprises a mixing unit MIX and a plane deflection mirror GM (also referred to as G mirror GM), which is operated under grazing incidence. The illumination system shapes the radiation and thereby illuminates an illumination field BF situated in the object plane OS of the projection lens PO or in the vicinity thereof. In this case, the shape and size of the illumination field determine the shape and size of the effectively used object field in the object plane OS. During operation of the apparatus, the reflective reticle is arranged in the region of the object plane OS.

The mixing unit MIX substantially includes two facet mirrors FAC1, FAC2. The first facet mirror FAC1 is arranged in a plane of the illumination system which is optically conjugate with respect to the object plane OS. Therefore, it is also referred to as a field facet mirror. The second facet mirror FAC2 is arranged in a pupil plane of the illumination system that is optically conjugate with respect to a pupil plane of the projection lens. Therefore, it is also referred to as a pupil facet mirror.

With the aid of the pupil facet mirror FAC2 and the optical assembly disposed downstream in the beam path and comprising the deflection mirror GM operated with grazing incidence, the individual mirroring facets (individual mirrors) of the first facet mirror FAC1 are imaged into the illumination field.

The spatial (local) illumination intensity distribution at the field facet mirror FAC1 determines the local illumination intensity distribution in the illumination field. The spatial (local) illumination intensity distribution at the pupil facet mirror FAC2 determines the illumination angle intensity distribution in the illumination field OF.

The shape of the illumination field is determined substantially by the shape of the facets of the field facet mirror FAC1, the images of which fall into the exit plane of the illumination system. The illumination field can be a rectangular field or a curved field (ring field).

The beam-guiding region optically between the source position SP and the exit plane (plane of the image field) is the illumination beam path, in which the EUV radiation is successively incident during operation on the first facet mirror FAC1, the second facet mirror FAC2 and the deflection mirror GM.

Figure 2:
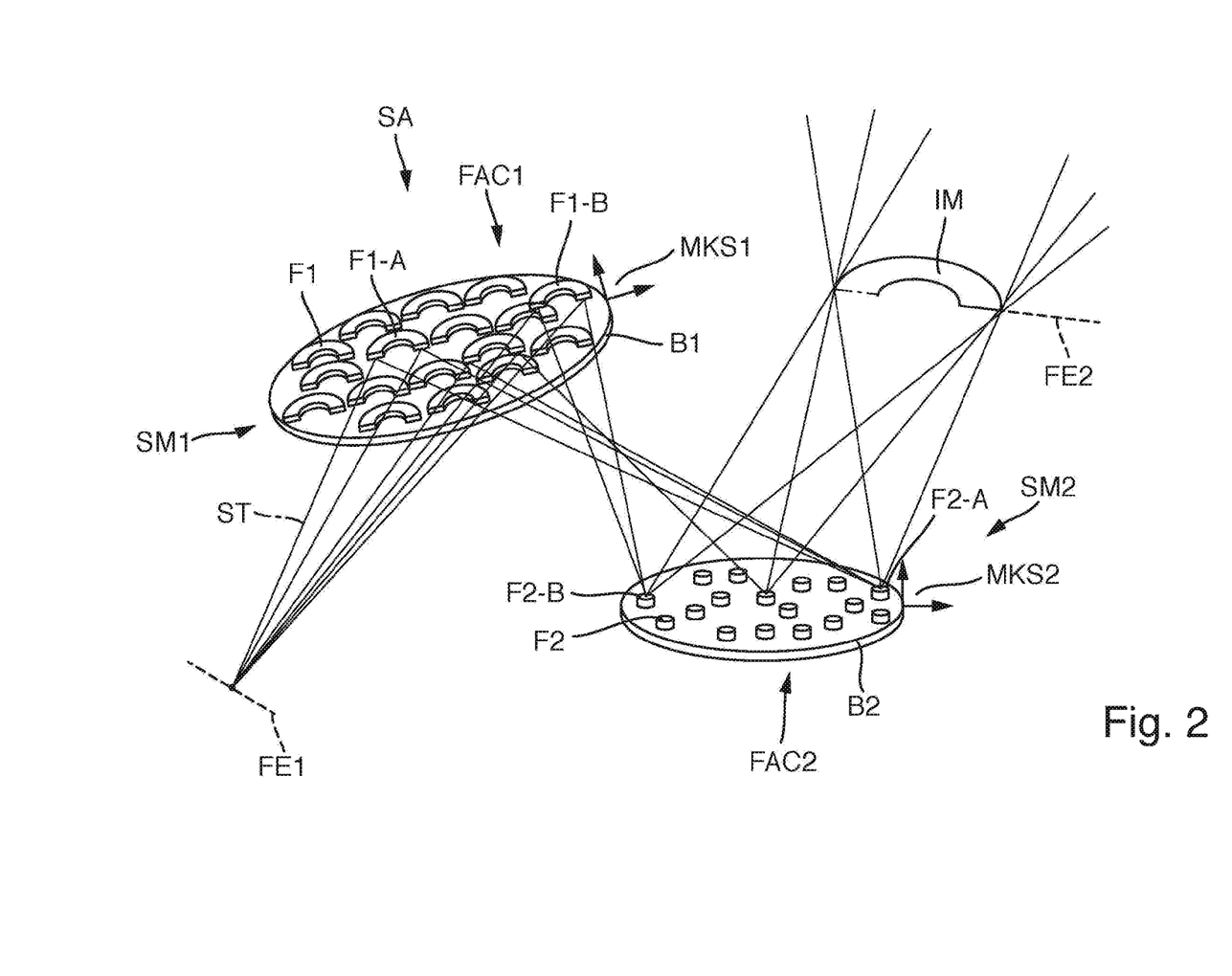
FIG. 2 shows a number of ray trajectories in a mirror arrangement having two facet mirrors.

For further explanation, FIG. 2 schematically illustrates a mirror arrangement SA, having a first facet mirror FAC1 and a second facet mirror FAC2.

The first facet mirror FAC1 has a multiplicity of first facets F1, which are in the form of elongate arcs in the exemplary embodiment shown. This shape of the first facets, however, should be understood to be merely exemplary. Only some of the facets are shown. The number of first facets in practice is typically significantly higher and can be more than 100 or even more than 300.

The second facet mirror FAC2 has a multiplicity of second facets F2, which are in the form of small dies in the exemplary embodiment shown, which again should be understood to be merely an example.

The first facets F1 are arranged on a first main body B1 of the first facet mirror FAC1. The first main body forms, together with the first facets it carries and any further components, e.g. attachment means, actuators etc., a first mirror module SM1.

The first mirror module SM1 can be installed in its entirety at the installation position that is provided therefor on an associated first carrier structure TS1 of the illumination system or be demounted again in its entirety and removed. The orientation of the first mirror module SM1 in space, or relative to a reference coordinate system (e.g. the SKS of the housing of the illumination system), can be defined by way of the first module coordinate system MKS1.

The second facets F2 are analogously arranged on a second main body B2 of the second facet mirror, as a result of which a completely installable and replaceable second mirror module SM2 is formed. The orientation of the second mirror module SM2 in space, or relative to a reference coordinate system, can be defined by way of the second module coordinate system MKS2.

The relative orientation or position of a mirror module with respect to the associated carrier structures (frame structure of the illumination system) or to the system coordinate system that is linked thereto can be continuously or incrementally set with great accuracy in six degrees of freedom. Suitable adjustment means are provided herefor, which can also be referred to as tilt manipulators. A tilt manipulator can include e.g. two set screws and a joint or three set screws which can have their movement direction perpendicular to a virtual mirror plane. However, a motor-driven mechanism may also be provided (e.g. a motor-driven set screw or a hydraulic set cylinder), which can also be used in a closed vacuum chamber. An incremental adjustment of the orientation by way of interchangeable spacers is likewise possible. The elements for orientation setting can be situated between the frame structure (carrier structure) of the illumination system and suitable interface points of a mirror module. Separate orientation sensors may be provided for capturing the installation orientation of a mirror module at its installation site. An orientation sensor can operate e.g. electrically, electromagnetically or optically. By way of example, three distance sensors (e.g. capacitive, interferometric or laser sensors) can be mounted to the frame structure and adjusted. Located at the associated mirror module can be corresponding counter-surfaces (targets), which are either adjusted very precisely with respect to the mirror module or have a position with respect to the module coordinate system which is very precisely known.

Drawn in FIG. 2 by way of example are a few rays ST illustrating the EUV illumination beam path when the mirror arrangement is installed in an optical system and in operation. The rays ST start here from a first field plane FE1 (intermediate focus), and are then reflected by the facets F1 of the first facet mirror FAC1 onto the facets F2 of the second facet mirror FAC2. The rays are directed by the facets F2 of the second facet mirror FAC2 into a second field plane FE2, corresponding to the exit plane of the illumination system. Images IM of the facets of the first facet mirror FAC1 are thereby produced in the second field plane FE2, wherein, in more precise terms, the images of all first facets F1 are produced in the field plane FE2 by mutual superposition. The superposed images IM together form the lit illumination field BF.

Between the facets F1 of the first facet mirror FAC1 and the facets F2 of the second facet mirror FAC2 there is a unique correspondence. That means that each facet F1 of the first facet mirror FAC1 is assigned a specific facet F2 of the second facet mirror FAC2. In FIG. 2, this is shown for a facet F1-A and a facet F1-B of the first facet mirror FAC1 and a facet F2-A and a facet F2-B of the second facet mirror FAC2. In other words, the rays ST that are reflected by the facet F1-A are incident exactly on the facet F2-A, and the used light rays that are reflected by the facet F1-B are incident on the facet F2-B etc. In this case, there is a one-to-one correspondence between the facets F1 of the first facet mirror FAC1 and the facets F2 of the second facet mirror FAC2.

In deviation from a one-to-one correspondence between the facets F1 and F2, it is also possible, however, that each facet F1 is assigned more than one facet of the facets F2. This is the case if the facets F1 are tiltable, that is to say can assume various tilted states, with the result that, in a first tilted state, each facet F1 is assigned a specific facet of the second facets F2, and, accordingly, in a different tilted state, is assigned a different facet of the second facets F2. Generally possible is a one-to-n correspondence (n being a natural number) between the first facets F1 and the second facets F2, depending on how many states the first facets F1 can assume.

The illumination beam path is composed of many individual illumination channels, wherein an illumination channel extends in each case from the source position or from the intermediate focus FE1, via a first facet F1 and a second facet F2 that is currently assigned to the first facet, into the illumination field.

In the exemplary embodiment shown of the mirror arrangement, the first facet mirror FAC1 is conjugate to the field plane FE2 and is therefore also referred to as a field facet mirror. In comparison, the second facet mirror FAC2 is conjugate to a pupil plane and is therefore also referred to as a pupil facet mirror.

In the case that the mirror arrangement is used in an illumination system of a projection exposure apparatus, the field plane FE2 is the plane in which the reticle is arranged, the pattern of which is intended to be imaged onto a wafer. In the case that the mirror arrangement SA is used in a mask inspection apparatus, the field plane FE2 is the plane in which the mask to be inspected is arranged.

In the exemplary embodiment of FIG. 1, the illumination system comprises, in addition to a mirror arrangement having two facet mirrors FAC1 and FAC2, which acts as a mixing unit MIX, also the field-shaping mirror FFM, which is operated under grazing incidence and is situated between the second facet mirror FAC2 and the exit plane or the object plane of the projection lens. This additional mirror can be favourable for reasons of installation space. In other exemplary embodiments, the illumination system has, in addition to the two facet mirrors FAC1 and FAC2, no further mirrors or else one or more further imaging or non-imaging mirrors in the illumination beam path.

In the illumination system ILL from FIG. 1, all three mirror modules, i.e. the first field facet mirror FAC1, the second field facet mirror FAC2 and the deflection mirror GM, are in each case replaceable in their entirety. That is to say, after releasing corresponding attachment means, they can be removed from their respective installation positions and be replaced by other components, for example components which are nominally of the same construction, without completely disassembling the illumination system. This has been instituted, inter alia, because it may be possible for the mirror properties to degrade after prolonged irradiation with high-energy EUV radiation to the point where the intended overall performance of the illumination system can no longer be ensured. Replacement of a mirror module may be appropriate for other reasons as well, for example if, in a facet mirror having facets which are resettable by way of actuators, facet resetting fails.

The replacement of a mirror module should be able to be performed within a short period of time and, after the mirror exchange, the illumination system should once again fulfil its desired function. In particular, the position of the illumination field in the exit plane should be situated sufficiently close to its desired position and the radiation should again be incident on the illumination field with the same angle distribution at a given illumination setting as before the mirror exchange.

Since it is not possible, despite narrow manufacturing tolerances, to ensure that the optical performance of the illumination system after replacement of a mirror module systematically corresponds again to the desired performance before the mirror exchange, auxiliary means are provided in the illumination system of the exemplary embodiment that permit the systematic optimization of the mirror positions after installation such that the desired optical performance can be achieved within an acceptable time period. The devices make possible a targeted adjustment of the illumination system at the site of its use, that is to say for example at the place of manufacture of semiconductor chips.

For this reason, inter alia, the illumination system of the exemplary embodiment is equipped with components of a measurement system MES which permits optical acquisition of information for determining the orientations of the mirror modules in the respective installation positions that are associated with the mirror modules, with the result that the adjustment can be systematically made on the basis of the measurement values which are obtained by the measurement system. The measurement system MES of the exemplary embodiment has the following components.

A measurement light source module MSM includes a measurement light source MLS for emitting measurement light from the visible spectral range. The measurement light source used can be, for example, a light-emitting diode (LED) or a laser diode. The measurement light source module MSM is arranged at the housing H of the illumination system outside the evacuable interior by way of first interface structures IF1, can be mounted for measurement purposes and, if desired, removed again and may be used for measurement purposes at a different location. In some embodiments, the position of the measurement light source module with respect to the housing can be changed using positioning drives in terms of multiple axes and both parallel to the central radiation direction and perpendicular thereto. An exemplary embodiment of a measurement light source module will be explained in more detail in connection with FIG. 3.

A switchable input coupling device IN is provided for coupling measurement light emitted by the measurement light source module MSM into the illumination beam path at an input coupling position upstream of the first facet mirror FAC1. The input coupling device comprises a plane mirror, which serves as the input coupling mirror MIN and which can be panned between a neutral position (illustrated in dashed lines) outside the illumination beam path and the input coupling position (illustrated in solid lines) using an electric drive. In the case of the example, the measurement light source module produces an image of the measurement light source MLS at the site of the source position SP (intermediate focus of the EUV radiation). The input coupling mirror MIN can be panned such that the measurement light beam is coupled into the illumination beam path at the site of the source position SP as if the measurement light source MLS were located at the site of the source position SP. With this arrangement, it is thus possible to imitate or reproduce the source beam present in EUV operation by way of measurement light.

Situated behind the last mirror module of the illumination beam path, that is to say in the example of FIG. 1 behind the deflection mirror GM, in the region between the deflection mirror GM and the exit plane of the illumination system (object plane OS of the projection lens), is a switchable output coupling device OUT for coupling measurement light out of the illumination beam path, wherein the measurement light is coupled out after the measurement light has been reflected at each of the mirror modules of the illumination beam path. The switchable output coupling device comprises a plane mirror, which is used as the output coupling mirror MOUT and which can be panned between the neutral position (illustrated in dashed lines) outside the illumination beam path and the output coupling state (illustrated in solid lines) using an electric drive. In the output coupling state, the output coupling mirror reflects the measurement light coming from the deflection mirror GM in the direction of a detector module position, in which a detector module DET is arranged.

The detector module DET is embodied as a compact, portable detector module that, when desired, can be fastened to the envisaged detector position for measurement purposes and that can be disassembled again without much outlay in the case of non-use.

With the aid of second interface structures IF2, the removable or interchangeable detector module DET is fastened with its detector position being stationary (i.e., immobile or in a fixed position) to the outer side of the housing H of the illumination system. Where desired, the detector position can be set exactly with the aid of alignment screws or the like. However, there are no electrical positioning drives or positioning drives that are controllable in any other way in order to adjust the position of the detector module in relation to the housing H. Displacement shafts for displacing the detector module in relation to the housing H of the illumination system and/or displacement shafts for displacing optical components within the detector module are not envisaged. An exemplary embodiment will be explained in more detail in connection with FIG. 4 and FIG. 5.

All controllable components of the measurement system MES are connected in signal-transmitting fashion to the control unit SE of the measurement system in the ready-for-operation installed state of the measurement system. Also situated in the control unit is an evaluation unit for evaluating the measurement values obtained using the measurement light, which measurement values represent the alignment state of the mirror modules within the illumination system.

Figure 3:
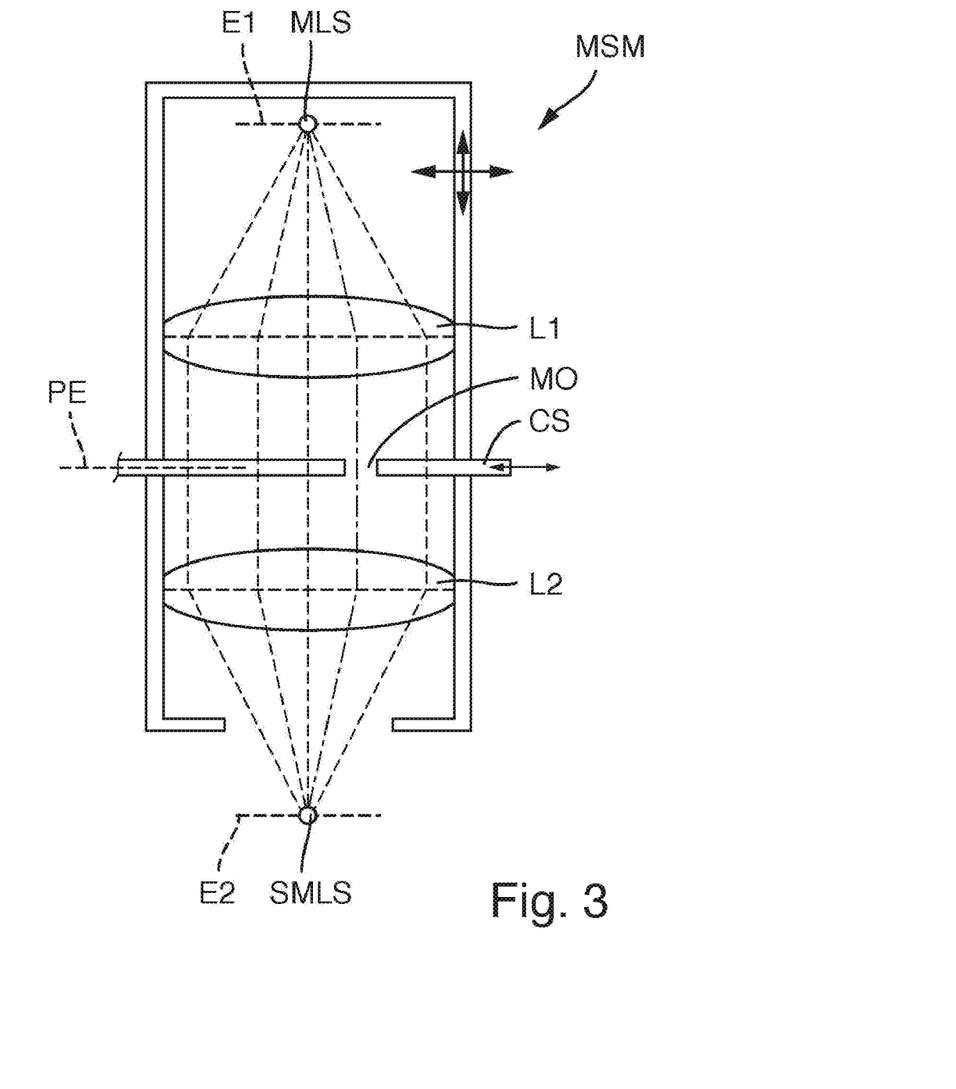
FIG. 3 shows an exemplary embodiment of a measurement light source module.

On the basis of FIG. 3, an exemplary embodiment of a measurement light source module MSM is explained in more detail, which can be used for example in the measurement system from FIG. 1. A primary measurement light source MLS, for example in the form of an LED, is arranged in an entrance plane E1. Arranged within the housing are lens elements L1, L2 of a 2f imaging system, with which an image of the primary measurement light source MLS, that is to say a secondary measurement light source SMLS, is produced in an exit plane E2, which is optically conjugate to the entrance plane E1. Situated between the entrance plane and the exit plane is a pupil plane PE, which is a plane that is Fourier-transformed in relation to the entrance plane and exit plane. Located in the region of the pupil plane PE is a stop CS having an aperture MO, through which a selected portion of the measurement light can pass. The position of the aperture MO is freely selectable in two dimensions within the pupil plane. The displaceable stop CS can thus be used to select a specific portion of the measurement light for emission. The site of the through-opening in the pupil plane here determines the angle of incidence of the measurement light, which was allowed to pass, at the site of the secondary measurement light source SMLS and consequently also the beam angle of the measurement light from the measurement light source module. In this way, various individual channels or channel groups of the illumination system can be selected for a measurement.

An embodiment of a measurement light source module, not illustrated pictorially, has a substantially less complex embodiment; by way of example, it has no two-dimensional adjustable stop and therefore does not allow a channel-resolved measurement. Such a simple embodiment may suffice, particularly in the case of the relative measurements described here. Therein, it is not necessary to measure the relative orientation of individual channels. It is possible to measure the relative orientation of the superposition of all channels at one time. Then, it is possible to use a very simple design, for example, an LED in the position of the secondary measurement light source SMLS.

Figure 4:
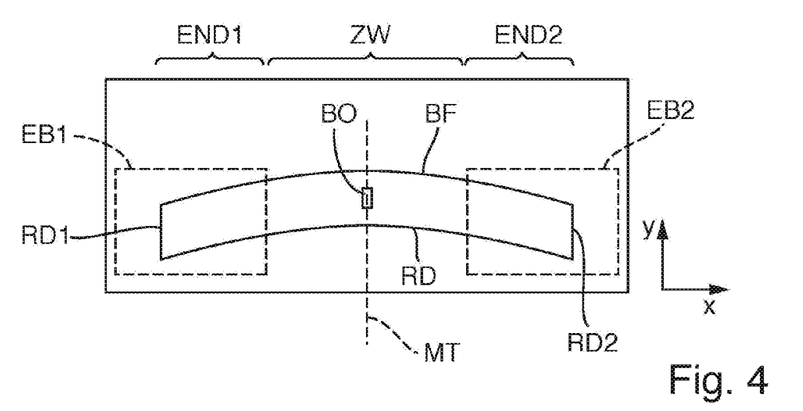
FIG. 4 shows the form of an illumination field that is curved in arcuate fashion and that has two end portions and an intermediate portion lying therebetween, wherein the end portions lie within rectangular capture regions of two field sensors and an aperture of a pupil sensor arrangement lies in the intermediate region.
Figure 5:
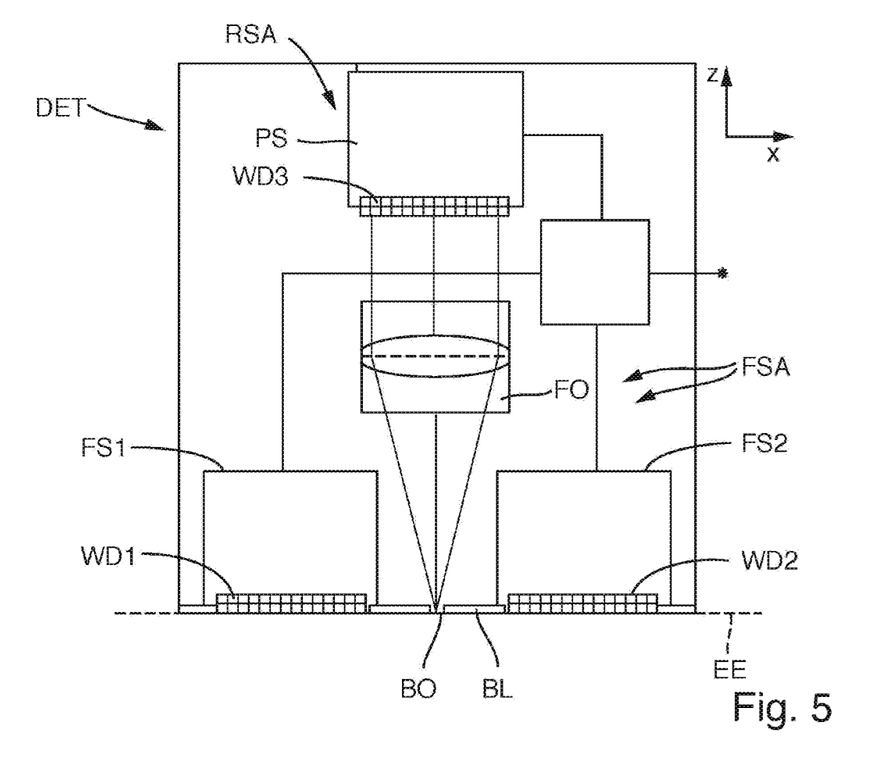
FIG. 5 shows an exemplary embodiment of a detector module, by which the illumination field shown in FIG. 4 can be measured simultaneously in the end regions and the intermediate region.

Some peculiarities when performing measurements within the scope of an embodiment of the method are illustrated on the basis of FIG. 4. FIG. 5 schematically shows an exemplary embodiment of a detector module in DET, which is a constituent part of a measurement system MES for measuring system measurement variables of the illumination system ILL.

Schematic FIG. 4 shows the form of an illumination field BF that is curved in arcuate fashion ("ring field"), the height of which in the scanning direction (y-direction) is multiple times larger than the width B of the illumination field in the cross-scan direction (x-direction) perpendicular to the scanning direction. The illumination field that is curved in arcuate fashion can be imagined to be subdivided into a first end portion END1, which can be identified to the left in FIG. 4, a second end portion END2, which lies opposite the first end portion in the x-direction, and an intermediate portion ZW, lying between the end portions END1, END2, in which the central plane MT lies, the central plane being a plane of the mirror symmetry of the illumination field in the exemplary case. The illumination field is delimited by an edge RD, at which there is, over a short distance, a relatively strong intensity drop between a relatively high illumination intensity in the interior of the illumination field and a very low intensity outside of the illumination field.

During the operation of the illumination system, the illumination intensity within the intermediate region is relatively constant, while the intensity of the illumination light within the end portions END1, END2 drops slightly in the lateral direction towards the outer edges RD1, RD2 (i.e., in the x-direction), and so, subsequently, there is in each case an intensity gradient in the x-direction at the outer edges RD1, RD2 within the illumination field. These intensity gradients result from the above-described superposition of the images of numerous field facets of the field facet mirror and represent a desired property of the intensity distribution within the illumination field.

In the measurements described here, an interchangeable detector module DET of a measurement system is used, wherein the detector module, in principle, can be constructed as illustrated in FIG. 5, for example. The detector module DET comprises a field sensor arrangement FSA, with which it is possible to simultaneously capture the spatial distribution of the intensity of the illumination field in the first field portion END1 and in the opposite second field portion END2, wherein the spatial intensity distribution in the intermediate region ZW cannot be captured. From these spatial distributions, it is possible to determine the position of the illumination field in the end regions, and hence also the position of the entire illumination field. Moreover, a pupil sensor arrangement PSA is integrated; it can be used to capture the spatial distribution of measurement light in a pupil plane that is Fourier-transformed in relation to the exit plane of the illumination system for at least one field point lying in the intermediate portion ZW.

The field sensor arrangement FSA comprises a first field sensor FS1 and, separate therefrom, a second field sensor FS2, the field sensors being arranged at mutual distance from one another in such a way that the rectangular capture region EB1 of the first field sensor FS1 can capture the first end portion END1 and the rectangular capture region EB2 of the second field sensor FS2 can capture the second end portion END2 (see FIG. 4). Each of the field sensors comprises an optoelectronic transducer WD1, WD2 that is sensitive to measurement light, and associated electronics. By way of example, the sensors could be embodied as CCD or CMOS sensors in order to be able to record the intensity distribution in the respectively assigned capture region with a sufficiently high spatial resolution. The light-sensitive entrance surfaces of the field sensors FS1, FS2 lie in a common plane, which corresponds to the entrance plane EE of the detector module.

A stop BL that is opaque to the measurement light, with an aperture BO lying in the entrance plane EE, is arranged in the region between the field sensors. The stop BL is part of the pupil sensor arrangement. In the exemplary case, the aperture is formed as a quadratic aperture (see FIG. 4), which lies in the central plane MT in centred fashion. In other initial shapes, the aperture is embodied as a slit opening that lies centred to the central plane, the slit opening extending completely in the y-direction beyond the edges of the illumination field. A pinhole with a circular aperture is also possible. An off-centred arrangement of the aperture is also possible. The pupil sensor arrangement PAS furthermore includes a third sensor (pupil sensor PS) with an areal extent, which is recessed in relation to the entrance plane EE. A Fourier optical unit FO is arranged between the aperture BO and the light-sensitive entrance surface at the transducer WD3 of the pupil sensor PS, and so the light-sensitive entrance surface of the pupil sensor PS is situated in a plane that is Fourier-transformed in relation to the entrance plane EE. The measurement light coming from the illumination system is guided through the aperture BO in the entrance plane EE and through the Fourier optical unit FO onto the entrance surface of the pupil sensor PS. With the aid of the Fourier optical unit, a pupil map is created, with which the spatial distribution of the illumination intensity in the pupil plane of the illumination system for a field point in the region of the aperture BO is mapped onto the light-sensitive entrance surface of the pupil sensor PS.

Figure 6:
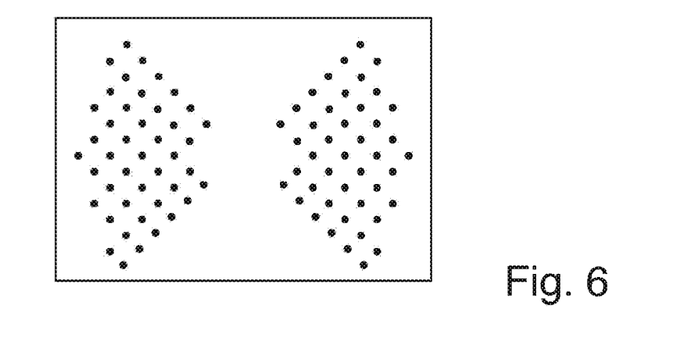
FIG. 6 shows a possible distribution of measurement light spots in the region of a pupil plane of the illumination system or at the light-sensitive entrance surface of the pupil sensor optically conjugate thereto.

FIG. 6 shows an exemplary possible distribution of measurement light spots in the region of the pupil facet mirror FAC2, which is optically conjugate to the light-sensitive entrance surface of the pupil sensor PS. The light spot distribution shown corresponds to a set dipole illumination with two diametrically opposite illumination poles.

Consequently, the detector module contains two field sensors FS1, FS2, which are able to cover the end regions of the elongate illumination field lying opposite one another. Measuring the spatial distribution of the intensity within these end regions is used to establish the position or relative orientation of the illumination field in space with sufficient accuracy. Particularly in the case of an illumination field that is curved in arcuate fashion, the measurement in both end regions of the long axis of the intensity distribution is advantageous. In these end regions, the intensity distribution is recorded in each case with a sufficiently high spatial resolution.

Furthermore, provision is made of a pupil sensor PS in order, for the purposes of determining the telecentricity, to measure the spatial distribution of measurement light in a pupil plane that is Fourier-transformed in relation to the exit plane for at least one field point lying in the intermediate portion ZW. Here, it is possible to choose a stop with slit-shaped aperture that is aligned in the scanning direction (movement direction, y-direction) of the EUV apparatus for the purposes of recording a "scan-integrated" measurement. In the relative measurements, described here, for the purposes of the comparison between reference measurement and comparison measurement, other forms of apertures suffice, for example a round aperture or a quadrilateral aperture since only the performance before and after the swap operation have to be measured sufficiently accurately in the case of a relative alignment.

The relative orientation of the field point or the field points that should be determined for the telecentricity is irrelevant to a first approximation in the case of a relative measurement. In the exemplary case, the measurement is carried out centrally between the outer edges RD1, RD2 within the intermediate region ZW since the end regions are captured by the field sensors. On account of the mechanical extent of the field sensors and of the optical beam path of the pupil sensor, an arrangement of the aperture in the centre of the illumination field, i.e., with the greatest clear space to the field sensors, is considered to be advantageous.

The detector module DET can be assembled in such a way that the entrance plane EE coincides with the exit plane of the illumination system or the object plane OS of the projection lens PO. However, this arrangement is not mandatory. As illustrated in FIG. 1, the entrance plane EE can also be arranged in a position that is equivalent thereto, for example if the measurement light is output coupled via a plane mirror (output coupling mirror).

It is also possible for the entrance plane EE of the detector module to lie significantly outside of a field plane, for example offset by several millimetres thereto in a region in which the partial fields that are superposed in the illumination field have a better overlay such that the intensity drop of the illumination light toward the outer ends in the x-direction extends with a steeper gradient.

The field sensors FS1, FS2 of the field sensor arrangement can be configured as areally measuring camera chips (CCD/CMOS chips), like in the exemplary embodiment. Alternatively, it is also possible to use sensors with a significantly lower spatial resolution, for example in the form of 4-quadrant diodes. In relation to the extent of the illumination field BF, the diodes should then be arranged in such a way that the centres thereof lie in a region of the illumination field that has an intensity gradient. Then, the relative orientation of the illumination field in the x- and y-direction can be determined by way of the relationships of the diode signals in the quadrants.

Figure 7A:
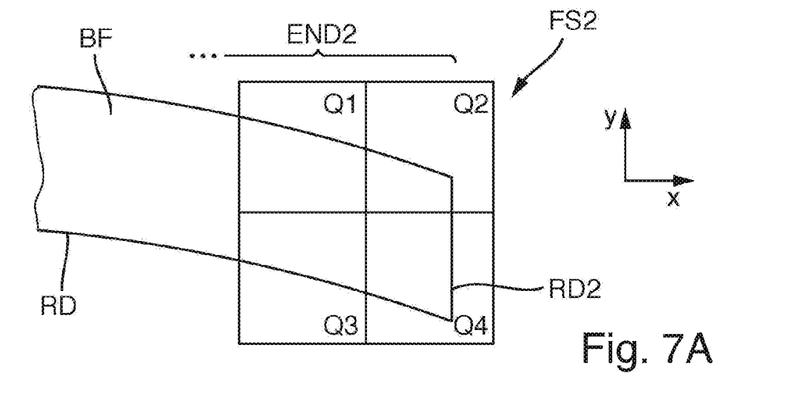
FIG. 7A shows an end region of the illumination field, which, in this end region towards the edge, has an intensity gradient with a decreasing intensity in the xdirection, wherein the end portion is measured via a field sensor with a 4-quadrant dipole.
Figure 7B:
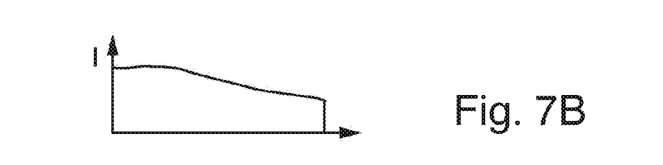
FIG. 7B shows a diagram of the intensity of the measurement light as a function of the location in the x-direction.

For the purposes of elucidating an example, FIG. 7A schematically shows the second end region END2 of an illumination field BF, which, in the end portion in the direction of the outer edge RD2, has a gradual intensity drop to the outer edge RD2, i.e., an intensity gradient in the x-direction, on account of the non-exact overlay of the images of the individual facets of the field facet mirror. FIG. 7B shows a diagram of the intensity I as a function of the location in the x-direction. The spatial intensity distribution is established in this region using a 4-quadrant diode with quadrants Q1 to Q4. It acts as a second field sensor FS2. Here, the centre of the diode lies in the region of the intensity gradient.

Figure 8:
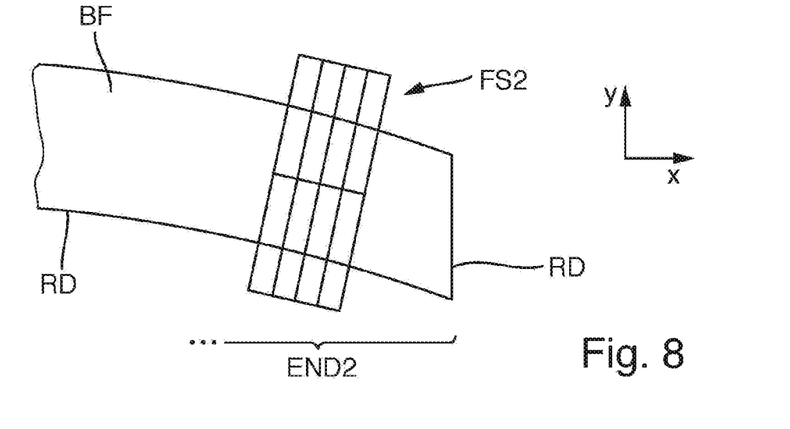
FIG. 8 schematically shows the measurement with a field sensor that is twisted in relation to the x-y-axis directions, wherein an outer edge of the illumination field lies outside of the capture region of the field sensor.

Instead of a 4-quadrant diode, it is also possible to use another multi-diode as a field sensor or field position sensor. By way of example, elongated diodes can also be combined to form a multi-diode. A second field sensor FS2, which has a multi-diode with a total of eight respectively elongate individual diodes, is described on the basis of the schematic FIG. 8. This variant has two peculiarities. Firstly, the multi-diode is twisted in relation to the axes of the xy-coordinate system, and so a central axis lies substantially parallel to the central axis of the end portion of the curved illumination field. Furthermore, it is visible that the capture region of this field sensor does not include the outer edge RD2. Rather, the outer edge RD2 lies outside of the capture region of the field sensor. Such an arrangement is always possible when the capture region is placed in such a way that an intensity gradient in the illumination field is situated within the capture region. In the case of the relative measurement described here, it is sufficient to compare this intensity drop during the comparison measurement with the intensity drop during the reference measurement and undertake the alignment in such a way that the intensity drops correspond within the scope of tolerances.

In the previous examples, the measurement system MES operates with measurement light from the visible wavelength range (VIS). This is not mandatory. In principle, EUV light can also be used as measurement light. In this case, care should be taken that the optoelectronic transducers used in the field sensors and the pupil sensor are EUV-sensitive in each case, i.e., sensitive to EUV radiation. By way of example, the use of back-illuminated CCDs is considered here. It is likewise possible to use a conventional CCD/CMOS chip that is sensitive to visible light with a converter layer (e.g., Cer-YAG), which converts EUV light into visible light. Using such a converter layer, it is also possible to use "normal" 4-quadrant diodes, i.e., 4-quadrant diodes that are sensitive to visible light. Furthermore, care should be taken that the Fourier optical unit of the pupil sensor arrangement in this exemplary embodiment is constructed purely from mirrors that reflect the EUV radiation.

A further peculiarity of the relative measurements involves position of the measurement light source not having to correspond exactly to the position of the intermediate focus of the EUV light source, as described in the exemplary embodiment of FIG. 1. Slight positional deviations in the beam direction or transverse to the beam direction are possible for as long as the radiation passes through the entire illumination beam path. Thus, the relative measurement imposes slightly lower demands on the accuracy when positioning the measurement light source.

A preferred application lies in the relative measurement, i.e., a comparison between reference measurement (prior to a mirror module swap) and comparison measurement (after a mirror module swap) in combination with a system alignment in order to re-establish the system performance. In these cases of application, the measurement light field module and the detector module can be installed in advance at an envisaged installation position and can be disassembled again after the alignment.

If the detector module is designed to receive and process EUV light, the detector module can also be used for process-accompanying monitoring during the operation in the case of an installed and evacuated illumination system. Such a detector module, which is optionally securely installed, may be selectively impinged by EUV radiation from the illumination beam path, for example, via a folding mirror, as explained in conjunction with FIG. 1, in order to periodically measure the long-term performance of the illumination system.

Within the scope of the embodiments described here and the claimed disclosure, it is possible to perform alignment methods which permit the optimization of the mirror position (orientation of a mirror module in its installation position) after installation, such that the desired optical performance of the entire illumination system can be reliably achieved. In many method variants, the measurement system is used to capture three system measurement variables or performance measurement variables, specifically (i) the position of the illumination field at the reticle level or in the exit plane of the illumination system (corresponding to the object plane OS of the projection lens), (ii) the spatial distribution of measurement light in a pupil plane of the illumination system that is Fourier-transformed in relation to the exit plane, the spatial distribution determining the telecentricity at the reticle level or in the exit plane, and (iii) a luminous spot deposition on pupil facets, i.e. the position of a measurement light spot on a facet of the second facet mirror FAC2.

The measurement mode for determining the position of the illumination field is also referred to as the "measurement mode for the field position". The measurement mode with which the local distribution of measurement light in the pupil plane is determined is also referred to as the "measurement mode for telecentricity". The measurement mode for determining the luminous spot deposition on pupil facets is also referred to as the "spot measurement mode".

The basic principles of such measurements are described in WO 2017/153165 A1 by the applicant in conjunction with the use of a displaceable detector module with a single field sensor and a single pupil sensor. Analogous measurement and evaluation methods can be used within the scope of the present disclosure, provided they do not comprise capture of pupil information for a multiplicity of field points (field-dependent pupil measurement). In respect of the measurement and evaluation methods, the disclosure of WO 2017/153165 A1 is incorporated into the content of the present description by reference.

What is claimed is:

1. A method for restoring an illumination system of an EUV apparatus, the illumination system configured to receive EUV radiation and to shape, from at least a portion of the received EUV radiation coming from a source position, illumination radiation directed into an illumination field in an exit plane of the illumination system, the illumination system comprising a plurality of mirror modules at assigned installation positions and defining an illumination beam path leading from the source position to the illumination field, the plurality of mirror modules comprising a first mirror module assigned a first installation position, the method comprising:

i) determining a reference state which represents an adjustment state of the illumination system before a swap operation by a method comprising:
measuring a first end portion of the illumination field and a second end portion of the illumination field which is opposite the first end portion of the illumination field without measuring an intermediate portion of the illumination field between the first and the second end portions of the illumination field; and
measuring a spatial distribution of measurement light in a pupil plane that is Fourier-transformed in relation to the exit plane for a field point lying in the intermediate portion;

ii) after i), performing the swap operation, the swap operation comprising:
disassembling the first mirror module from its installed position and removing the mirror module from the illumination system;
installing a replacement mirror module, having a nominally same design as the first mirror module, in the first installation position; and
adjusting the replacement mirror module in rigid body degrees of freedom in the first installation position while changing the relative orientation of the replacement mirror module; and iii) after performing the swap operation, determining a reference state which represents an adjustment state of the illumination system after the swap operation by a method comprising:
measuring a first end portion of the illumination field and a second end portion of the illumination field which is opposite the first end portion of the illumination field without measuring an intermediate portion of the illumination field between the first and the second end portions of the illumination field; and
measuring a spatial distribution of measurement light in a pupil plane that is Fourier-transformed in relation to the exit plane for a field point lying in the intermediate portion of the illumination field; and iv) based on a comparison of the reference state determined before the swap operation to the reference state after the swap operation, restoring the adjustment state of the illumination system to the adjustment state before the swap operation.

2. The method of claim 1, wherein i) and iii) are performed as non-scanning measurements using a detector module, assembled at a fixed position, without displaceable optical components.

3. The method of claim 1, wherein i) and iii) comprise simultaneously measuring the positions of the first and second end portions and the spatial distribution of the measurement light in the pupil plane for the field point lying in the intermediate portion.

4. The method of claim 1, wherein i) and iii) comprise measuring, only for a single field point lying in the intermediate portion, the spatial distribution of measurement light in the pupil plane that is Fourier-transformed in relation to the exit plane.

5. The method of claim 1, wherein i) and iii) comprise measuring, for a field point lying centrally between the first and second end portions of the illumination field, the spatial distribution of measurement light in a pupil plane that is Fourier-transformed in relation to the exit plane is.

6. The method of claim 1, wherein the measurement light has a different wavelength range from the EUV radiation utilized during operation of the illumination system.

7. The method of claim 1, wherein the measurement light has a wavelength range that comprises a member selected from the group consisting of part of the visible spectral range, part of a UV spectral range adjoining the EUV range, and part of a UV spectral range adjoining the IR range.

8. The method of claim 1, wherein i) and iii) comprise establishing at least member selected from the group consisting of:
a position of the illumination field in the exit plane;
a spatial distribution of measurement light in pupil plane that is Fourier-transformed in relation to the exit plane of the illumination system; and
a position of a measurement light spot on a facet of the second facet mirror.

9. The method of claim 1, wherein i) and iii) comprise establishing:
a position of the illumination field in the exit plane;
a spatial distribution of measurement light in a pupil plane that is Fourier-transformed in relation to the exit plane of the illumination system; and
a position of a measurement light spot on a facet of the second facet mirror.

10. The method of claim 1, wherein:
i) and iii) are performed as non-scanning measurements using a detector module, assembled at a fixed position, without displaceable optical components; and
i) and iii) comprise simultaneously measuring the positions of the first and second end portions and the spatial distribution of the measurement light in the pupil plane for the field point lying in the intermediate portion.

11. The method of claim 1, wherein:
i) and iii) are performed as non-scanning measurements using a detector module, assembled at a fixed position, without displaceable optical components; and
i) and iii) comprise measuring, only for a single field point lying in the intermediate portion, the spatial distribution of measurement light in the pupil plane that is Fourier-transformed in relation to the exit plane.

12. The method of claim 1, wherein:
i) and iii) are performed as non-scanning measurements using a detector module, assembled at a fixed position, without displaceable optical components; and
i) and iii) comprise measuring, for a field point lying centrally between the first and second end portions of the illumination field, the spatial distribution of measurement light in a pupil plane that is Fourier-transformed in relation to the exit plane is.

13. The method of claim 1, wherein:
i) and iii) are performed as non-scanning measurements using a detector module, assembled at a fixed position, without displaceable optical components; and
the measurement light has a different wavelength range from the EUV radiation utilized during operation of the illumination system.

14. A detector module configured to be used in a measurement system to measure system measurement variables in an illumination field in an exit plane of an illumination system in an EUV apparatus, the detector module comprising:
a field sensor arrangement configured to capture positions of a first end portion of an illumination field and a second end portion of the illumination field opposite the first end portion of the illumination field without capturing a position of the illumination field in an intermediate portion between the first and the second end portions of the illumination field; and
a pupil sensor arrangement configured to capture a spatial distribution of measurement light in a pupil plane that is Fourier-transformed in relation to the exit plane for a field point lying in the intermediate portion.

15. The module detector of claim 14, wherein the field sensor arrangement comprises:
a first field sensor configured to capture the position of the first end portion of the illumination field;
a second field sensor configured to capture the position of the opposite second end portion of the illumination field;
a pupil sensor; and
a stop comprising an aperture configured to pass measurement light from the intermediate region of the illumination field to the pupil sensor,
wherein the second field sensor is separate from the first field sensor, and the pupil sensor is between the first and second field sensors.

16. The detector module of claim 15, further comprising a Fourier optical unit comprise at least one member selected from the group consisting of a lens and a mirror, wherein the Fourier optical unit is between the aperture and the pupil sensor.

17. The detector module of claim 14, wherein the detector module has no movable parts.

18. The detector module of claim 14, wherein the detector module has no controllable displacement shafts to move optical components.

19. A method for monitoring an illumination system of an EUV apparatus, the illumination system configured to receive EUV radiation in an entrance plane and to shape, from at least a portion of the received EUV radiation from a source position, illumination radiation that is directed into an illumination field in an exit plane of the illumination system, the illumination system comprising a plurality of mirror modules at assigned installation positions and defining an illumination beam path leading from the source position to the illumination field, the method comprising:
i) determining an adjustment state of the illumination system at a first time interval by a method comprising:
measuring a position of a first end portion of the illumination field and a position of a second end portion of illumination field opposite to the first end portion of the illumination field without measuring a position of the illumination field in an intermediate portion between the first and the second end portions of the illumination field; and
measuring a spatial distribution of measurement light in a pupil plane that is Fourier-transformed in relation to the exit plane for a field point lying in the intermediate portion;
ii) after i), determining an adjustment state of the illumination system at a second time interval by a method comprising:
measuring a position of a first end portion of the illumination field and a position of a second end portion of illumination field opposite to the first end portion of the illumination field without measuring a position of the illumination field in an intermediate portion between the first and the second end portions of the illumination field; and
measuring a spatial distribution of measurement light in a pupil plane that is Fourier-transformed in relation to the exit plane for a field point lying in the intermediate portion; and
iii) comparing the adjustment state of the illumination system in the first time interval with the adjustment state of the illumination system in the second time interval.

20. The method of claim 19, wherein i) and iii) comprise using a detector module, comprising:
a field sensor arrangement configured to capture positions of the first and second end portions of an illumination field without capturing the position of the illumination field in the intermediate portion between the first and the second end portions of the illumination field; and
a pupil sensor arrangement configured to capture a spatial distribution of measurement light in a pupil plane that is Fourier-transformed in relation to the exit plane for a field point lying in the intermediate portion.

* * * * *

UNITED STATES PATENT AND TRADEMARK OFFICE
CERTIFICATE OF CORRECTION

PATENT NO. : 11,048,173 B2  
APPLICATION NO. : 16/849353  
DATED : June 29, 2021  
INVENTOR(S) : Florian Baumer Page 1 of 1

It is certified that error appears in the above-identified patent and that said Letters Patent is hereby corrected as shown below:

In the Specification

Column 1, Line 12, delete "10201729179.1," and insert -- 102017219179.1, --;

Column 8, Line 61, delete "xdirection," and insert -- x-direction, --;

In the Claims

Column 20, Line 42, Claim 5, delete "plane is." and insert -- plane. --;

Column 21, Line 25, Claim 12, delete "plane is." and insert -- plane. --;

Column 21, Line 49, Claim 15, delete "module detector" and insert -- detector module --.

Signed and Sealed this
Eighteenth Day of January, 2022

Drew Hirshfeld
*Performing the Functions and Duties of the*
*Under Secretary of Commerce for Intellectual Property and*
*Director of the United States Patent and Trademark Office*